(12) United States Patent
Jung et al.

(10) Patent No.: US 7,760,274 B2
(45) Date of Patent: *Jul. 20, 2010

(54) PROGRAMMABLE MASK FOR FABRICATING BIOMOLECULE ARRAY OR POLYMER ARRAY, APPARATUS FOR FABRICATING BIOMOLECULE ARRAY OR POLYMER ARRAY INCLUDING THE PROGRAMMABLE MASK, AND METHOD OF FABRICATING BIOMOLECULE ARRAY OR POLYMER ARRAY USING THE PROGRAMMABLE MASK

(75) Inventors: Moon Youn Jung, Daejeon (KR); Dong Ho Shin, Daejeon (KR); Se Ho Park, Daejeon (KR); Hyeon Bong Pyo, Daejeon (KR); Chi Hoon Jun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 658 days.

This patent is subject to a terminal disclaimer.

(21) Appl. No.: 11/634,408

(22) Filed: Dec. 6, 2006

(65) Prior Publication Data
US 2007/0134831 A1    Jun. 14, 2007

(30) Foreign Application Priority Data
Dec. 8, 2005  (KR) ............... 10-2005-0119460
Jun. 22, 2006  (KR) ............... 10-2006-0056528

(51) Int. Cl.
*G02F 1/13* (2006.01)
(52) U.S. Cl. ............... 349/2; 349/95; 349/96; 349/187
(58) Field of Classification Search ........... 349/95, 349/96, 110, 61, 63, 57, 151, 43, 2, 187; 438/30
See application file for complete search history.

(56) References Cited

U.S. PATENT DOCUMENTS 4,790,632 A  12/1988  Miyakawa et al.

(Continued)

FOREIGN PATENT DOCUMENTS

JP     6-153214 A    5/1994

(Continued)

OTHER PUBLICATIONS

European Search Report—dated Nov. 18, 2008; Application No./Patent No. 06125539.4-1226 / 1795965.

(Continued)

*Primary Examiner*—Thoi V Duong
(74) *Attorney, Agent, or Firm*—Ladas & Parry LLP (57) ABSTRACT

Provided are a programmable mask for promptly fabricating a biomolecule or polymer array having high density, an apparatus for fabricating a biomolecule or polymer array including the mask, and a method of fabricating a biomolecule or polymer array using the programmable mask. The programmable mask for fabricating a biomolecule array or polymer array includes a first substrate including a black matrix having openings and first pixel electrodes; a second substrate including thin film transistors for switching pixel regions which correspond to the openings according to applied electric signals and second pixel electrodes connected to drain electrodes of the thin film transistors; a liquid crystal layer interposed between the first substrate and the second substrate, the liquid crystal layer including liquid crystal whose arrangement can be changed according to electric signals of the thin film transistors so as to selectively transmit light; a first polarizing plate laminated on one side of the first substrate; a second polarizing plate laminated on one side of the second substrate; and a lens array layer laminated on one side of the second polarizing plate including lenses which correspond to the pixel regions.

13 Claims, 9 Drawing Sheets

U.S. PATENT DOCUMENTS

| | | | |
|---|---|---|---|
| 5,506,929 A * | 4/1996 | Tai et al. ............... | 385/146 |
| 5,959,098 A * | 9/1999 | Goldberg et al. ......... | 536/25.3 |
| 6,271,957 B1 | 8/2001 | Quate et al. | |
| 6,276,803 B1 * | 8/2001 | Aoyama et al. ............ | 353/81 |
| 6,379,847 B2 | 4/2002 | Cutter et al. | |
| 6,919,211 B1 | 7/2005 | Fodor et al. | |
| 2003/0214611 A1 | 11/2003 | Jung et al. | |
| 2004/0137606 A1 * | 7/2004 | Jung et al. ............ | 435/287.2 |
| 2009/0023609 A1 * | 1/2009 | Jung et al. ............... | 506/32 |

FOREIGN PATENT DOCUMENTS

| | | |
|---|---|---|
| JP | 09-257698 A | 10/1997 |
| JP | 63-44624 A | 2/1998 |
| JP | 2001-356337 A | 12/2001 |
| JP | 2002-502698 A | 1/2002 |
| JP | 2002-523781 A | 7/2002 |
| JP | 2004-138420 A | 5/2004 |
| JP | 2005-123475 A | 5/2005 |
| KR | 1020010002915 | 1/2001 |
| KR | 1020030026548 | 4/2003 |
| KR | 10-2003-0088773 | 11/2003 |
| KR | 1020030088773 | 11/2003 |
| KR | 1020040041823 | 5/2004 |
| KR | 1020060012686 | 2/2006 |
| WO | 99/41007 A2 | 8/1999 |
| WO | 00/13017 A3 | 3/2000 |
| WO | 03/064699 A2 | 8/2003 |

OTHER PUBLICATIONS

Jung, M.Y., et al., "DNA Microarray Liquid Crystal Programmable." Apr. 2004. The 6$^{th}$ Korean MEMS Conference, *Jeju*, pp. 145-149.

* cited by examiner

PROGRAMMABLE MASK FOR
FABRICATING BIOMOLECULE ARRAY OR
POLYMER ARRAY, APPARATUS FOR
FABRICATING BIOMOLECULE ARRAY OR
POLYMER ARRAY INCLUDING THE
PROGRAMMABLE MASK, AND METHOD OF
FABRICATING BIOMOLECULE ARRAY OR
POLYMER ARRAY USING THE
PROGRAMMABLE MASK

CROSS-REFERENCE TO RELATED PATENT
APPLICATION

This application claims the benefit of Korean Patent Application Nos. 10-2005-0119460, filed on Dec. 8, 2005, and 10-2006-0056528, filed on Jun. 22, 2006, in the Korean Intellectual Property Office, the disclosure of which is incorporated herein in its entirety by reference.

BACKGROUND OF THE INVENTION

1. Field of the Invention

The present invention relates to a programmable mask for fabricating a biomolecule array or polymer array, an apparatus for fabricating biomolecule array or polymer array including the programmable mask, and a method of fabricating biomolecule array or polymer array using the programmable mask.

2. Description of the Related Art

Research has been conducted on performing various kinds of experiments into one combined experiment using a biomolecule array or polymer array. Examples of a biomolecule array or polymer array include polypeptide, carbohydrate, or an array of nucleic acid (DNA, RNA). In order to conduct such an experiment, array having high density needs to be formed on a substrate with a reasonable price.

A conventional method of fabricating a biomolecule array or polymer array may be divided into spotting, electronic addressing and photolithography. Spotting is performed by having a micro robot selectively drop a biochemical substance on a desired spot while the micro robot three-dimensionally moves. Electronic addressing is performed by fixing a biomolecule to a specific electrode of a microelectrode array after controlling the electrode voltage. Photolithography is performed by selectively exposing a desired spot on a surface to light to change the surface, which then causes a reaction at a specific location due to bonding between the surface and a biomolecule at the specific location.

In more detail, the spotting method is divided into contact printing and non-contact printing in which a solution is stamped on a paper and a solution is dropped on a paper, respectively. In contact printing, loading, printing, and washing are sequentially performed by an XYZ robot. Non-contact printing can be divided into dispensing and ink-jet printing. Dispensing involves applying a solution in a dropwise fashion, like when a micropipette is used. Ink jet printing involves applying minute pressure to a reservoir which causes a solution to be ejected.

Electronic addressing involves fixing a biomolecule to a plate using a voltage control function of the microelectrode array. Electronic addressing can be divided into a method of generating a physicochemical bond by moving a biomolecule having an electric charge to the surface of an electrode and a method of fixing a biomolecule in a thin film when the thin film is formed by electrochemical deposition.

Photolithography used in a semiconductor production process can be used to manufacture an array having high density and enables parallel synthesis. However, a number of photo masks is required, thereby increasing cost and consuming time. Therefore, a programmable mask which can control light paths through a plurality of pixels without using a photo mask is being developed and is disclosed in U.S. Pat. No. 6,271,957. The programmable mask includes a method of regulating reflection of light and a method of regulating penetration of light. For example, a micromirror array or a liquid crystal display (LCD) can be used.

The method of fabricating a biomolecule array has two problems: fabrication of a high density pattern is difficult due to diffraction of incident light, and more time is needed for forming a biomolecule such as DNA synthesis, since light intensity is decreased due to an insufficient amount of light penetration on a polarizing plate disposed at both ends of a panel in a LCD. The reasons of raising such problems are described below.

Figure 1:
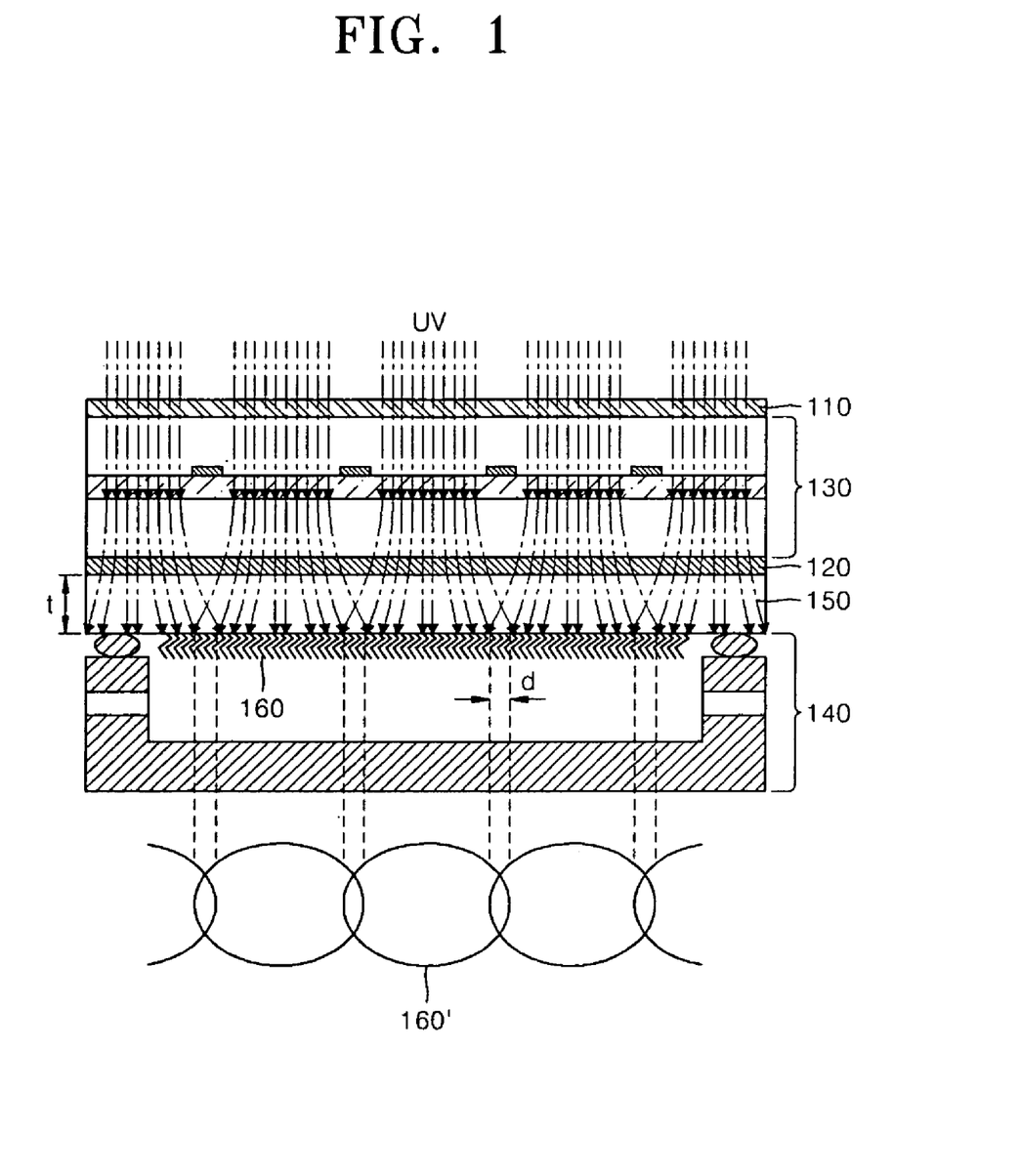
FIG. 1 is a side cross-sectional view of an apparatus for fabricating a biomolecule array or polymer array including a programmable mask, in which a conventional LCD is used.

FIG. 1 is a side cross-sectional view of an apparatus for fabricating a biomolecule array including a programmable mask, in which a conventional LCD is used. Referring to FIG. 1, the apparatus includes UV polarizing plates 110 and 120, a LCD panel 130 having a color filter excluded, a DNA synthesis chamber 140, and a DNA chip board 150. Oligomers 160 and 160' are synthesized at the bottom of the DNA chip board 150. UV light that has passed through the UV polarizing plates 110 and 120 passes through a chip having a thickness (t) and is diffracted, and thus, adjacent spots of UV light are overlapped (d). In other words, the diffraction of UV light is increased compared to the diffraction of UV in the width of a black matrix that isolates each pixel in an LCD. Therefore, when considering each pixel of a backlit LCD as an independent optical system, UV beams that have passed through a light pixel reach to the lower part of a glass substrate of a DNA chip and mix with each other. When this DNA chip is analyzed using a DNA scanner, not every DNA spot pattern is separated, and instead, it can be seen that the whole substrate of the chip is coated with oligomer. When an oligomer spot is observed on a plane surface, the overlapped oligomer 160' can be seen. Consequently, isolation of spots is not possible and thus, the chip cannot be embodied in the form of a spot array. In order to embody a spot array of an oligomer, not all pixels can be used, and instead, unused pixels should be arranged between pixels. Therefore, since not all of the LCD pixels can be used, an array having high density cannot be embodied.

Figure 2:
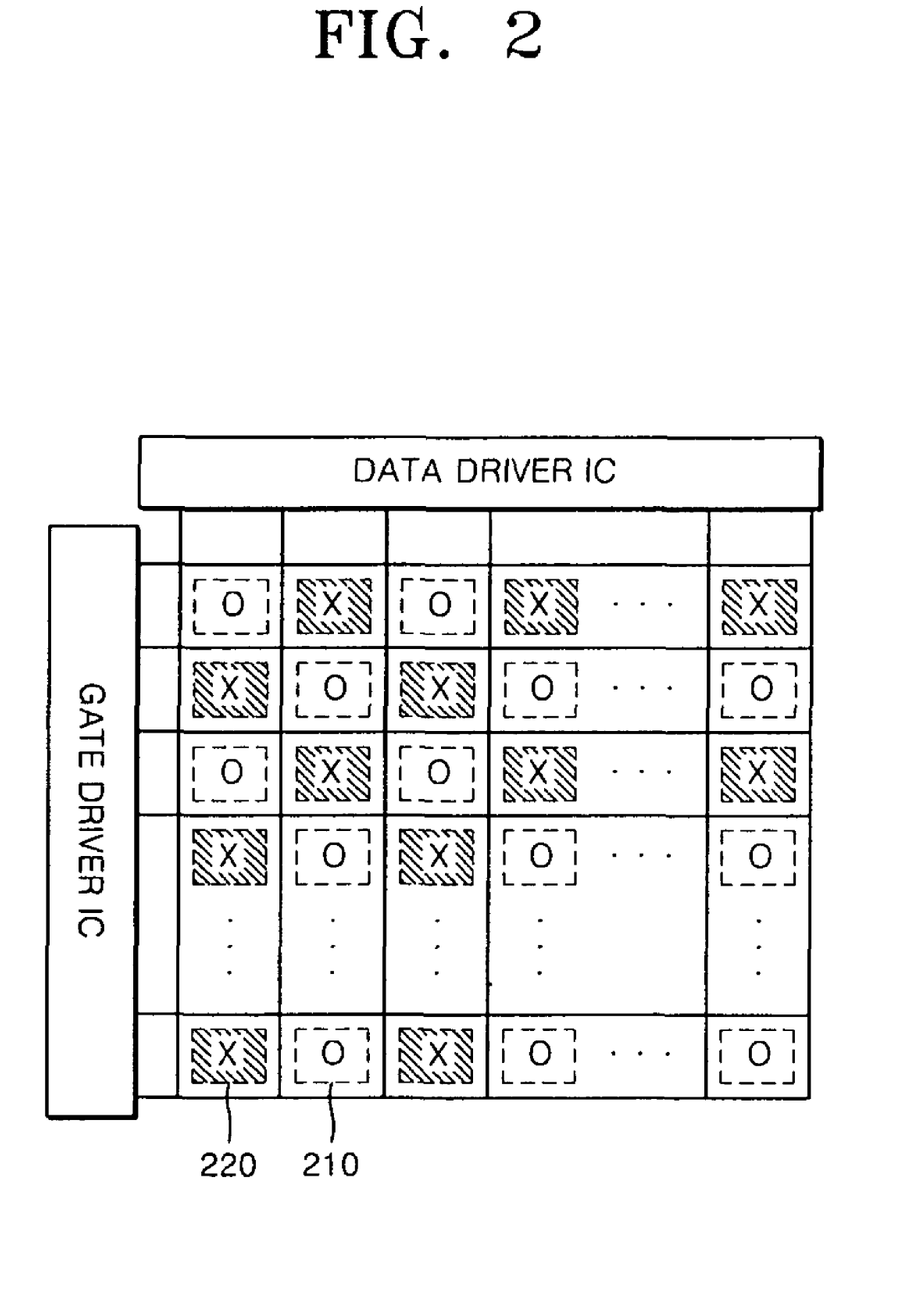
FIG. 2 is a plane view of a programmable mask and a driving circuit unit using a conventional LCD.

FIG. 2 is a plane view of a programmable mask and a driving circuit unit using a conventional LCD. Pattern isolation between adjacent pixels is not impossible as in FIG. 1, and pixels of the LCD should be driven in a mosaic pattern, as illustrated in FIG. 2. Each pixel in FIG. 2 is divided into domain pixels 210 (O) where an oligomer is attached and pixel areas 220 (X) where an oligomer is not attached. Since pixels X which are in complete blocking mode permanently intercepting UV light are maintained between operating pixels O, pattern mixing due to diffraction can be prevented. This also decreases the density of a DNA pattern on the oligomer chip.

Although a mosaic patterned oligomer array can be manufactured with an increase in the density of a DNA pattern, the amount of polarized light transmitted through a UV polarizing plate is small, and thus, UV exposure time which is 10 times greater is required compared to the case where photo masks for manufacturing the semiconductor are used.

SUMMARY OF THE INVENTION

The present invention provides a programmable mask for fabricating biomolecule or polymer array having high density in very short time.

The present invention also provides an apparatus for fabricating biomolecule or polymer array having high density in very short time.

The present invention also provides a method of fabricating biomolecule or polymer array having high density in very short time.

According to an aspect of the present invention, there is provided programmable mask for fabricating a biomolecule array or polymer array, the mask including: a first substrate including a black matrix having openings for incident UV and first pixel electrodes; a second substrate including thin film transistors for switching pixel regions which correspond to the openings according to applied electric signals and second pixel electrodes connected to drain electrodes of the thin film transistors; a liquid crystal layer interposed between the first substrate and the second substrate, the liquid crystal layer including liquid crystal whose arrangement can be changed according to electric signals of the thin film transistors so as to selectively transmit light; a first polarizing plate laminated on one side of the first substrate to polarize UV light; a second polarizing plate laminated on one side of the second substrate to polarize UV light; and a lens array layer laminated on one side of the second polarizing plate including lenses which correspond to the pixel regions.

The programmable mask may further include a driving circuit for driving the thin film transistors on the second substrate, the driving circuit being disposed outside the pixel regions.

The lens may be a hemispherical lens or a gradient index lens.

The polarizing plate may have high transmittance with respect to UV light having wavelength of 320-400 nm.

The biomolecule may be nucleic acid or protein.

The nucleic acid may be selected from the group consisting of DNA, RNA, PNA, LNA, and a hybrid thereof.

The protein may be selected from the group consisting of enzyme, substrate, antigen, antibody, ligand, aptamer, and receptor.

According to another aspect of the present invention, there is provided an apparatus for fabricating a biomolecule array or polymer array including: a UV light generator including a UV light source and a lens unit through which UV light irradiated from the UV light source passes; a programmable mask for fabricating a biomolecule or polymer; wherein the programmable mask includes: a first substrate disposed so as to be spaced apart from the UV light generator, the first substrate including a black matrix having openings for incident UV light and first pixel electrodes; a second substrate including thin film transistors for switching pixel regions which correspond to the openings according to applied electric signals and second pixel electrodes connected to drain electrodes of the thin transistors; a liquid crystal layer interposed between the first substrate and the second substrate, the liquid crystal layer including liquid crystal whose arrangement can be changed according electric signals of the thin film transistors so as to selectively transmit light; a first polarizing plate laminated on one side of the first substrate to polarize UV light; a second polarizing plate laminated on one side of the second substrate to polarize UV light; and a lens array layer laminated on one side of the second polarizing plate including lenses which correspond to the pixel regions; and an array forming chamber forming a biomolecule array or polymer array, wherein the array forming chamber is laminated on the programmable mask and includes a sample plate on which the biomolecule or polymer array is formed, and a washing solution and a biomolecule or polymer flow in and out of the array forming layer.

The UV light source may be a LED two dimensional array or a laser diode two dimensional array.

The lens unit of the UV light generator may include a homogenizer lens unit to make UV light generated by the UV light source uniform, a field lens to concentrate UV light generated by the homogenizer lens unit, and a convex lens to make UV light generated by the field lens parallel.

The focal point of the lens of the programmable mask may be formed on the sample plate where a biomolecule array or polymer array is formed.

The lens of the programmable mask may be a hemispherical lens or a gradient index lens.

According to another aspect of the present invention, there is provided a programmable mask for fabricating a biomolecule array or polymer array including: a first substrate including a black matrix having openings and first pixel electrodes; a second substrate including thin film transistors for switching pixel regions which correspond to the openings according to applied electric signals and second pixel electrodes connected to drain electrodes of the thin film transistors; a liquid crystal layer interposed between the first substrate and the second substrate, the liquid crystal layer including liquid crystal whose arrangement can be changed according to electric signals of the thin film transistors so as to selectively transmit light; a first polarizing plate laminated on one side of the first substrate to polarize UV light; and a second polarizing plate laminated on one side of the second substrate including a polarizing layer and a biomolecule or polymer fixed layer.

As another embodiment of the present invention, the second polarizing plate may include the polarizing layer, protecting layers laminated on both sides of the polarizing layer, and a biomolecule or polymer fixed layer having a hydrophilic surface on which a biomolecule or polymer can be fixed.

The second polarizing plate may be attached to and detached from the second substrate.

The programmable mask may further include a driving circuit for driving the thin film transistors on the second substrate, the driving circuit being disposed outside the pixel regions.

The polarizing plate may have high transmittance with respect to UV having wavelength of 320-400 nm.

The liquid crystal, as a liquid crystal in which dyes are included in a nematic liquid crystal, may be a guest-host type liquid crystal enabling to intercept or transmit light, since a vibration direction of linear polarized light and light absorption axis of the dyes are same or cross at right angles.

According to another aspect of the present invention, there is provided an apparatus for fabricating a biomolecule array or polymer array including: a UV light generator including a UV light source and a lens unit through which UV light irradiated from the UV light source passes; a programmable mask for fabricating a biomolecule or polymer; wherein the programmable mask includes: a first substrate disposed so as to be spaced apart from the UV light generator, the first substrate including a black matrix having openings and first pixel electrodes; a second substrate including thin film transistors for switching pixel regions which correspond to the openings according to applied electric signals and second pixel electrodes connected to drain electrodes of the thin transistors; a liquid crystal layer interposed between the first substrate and the second substrate, the liquid crystal layer including liquid crystal whose arrangement can be changed according to electric signals of the thin film transistors so as to selectively transmit light; a first polarizing plate laminated on one side of the first substrate to polarize UV light; and a second polarizing plate laminated on one side of the second substrate to polarize UV light including a polarizing layer and a biomolecule or polymer fixed layer; and an array forming chamber forming a biomolecule array or polymer array, wherein the array forming chamber is disposed on the lower part of the second polarizing plate, and a washing solution and a biomolecule or polymer flow in and out of the array forming layer.

The UV light source may be a LED two dimensional array or a laser diode two dimensional array.

The lens unit of the UV light generator may include a homogenizer lens unit to make UV light generated from the UV light source uniform, a field lens to concentrate UV light generated from the homogenizer lens unit, and a convex lens to make UV light generated by the field lens parallel.

The second polarizing plate may include the polarizing layer, protecting layers laminated on both sides of the polarizing layer, and the biomolecule or polymer fixed layer having a hydrophilic surface on which a biomolecule or polymer can be fixed.

The second polarizing plate may be attached to and detached from the second substrate.

According to another aspect of the present invention, there is provided an apparatus for fabricating a biomolecule array or polymer array including: a UV light generator including a UV light source and a lens unit, wherein UV light irradiated from the UV light source is passed through the lens unit; a programmable mask; wherein the programmable mask includes: a first substrate disposed so as to be spaced apart from the UV light generator to have a predetermined angle with a propagation path of UV light generated by the UV light generator, the first substrate including a black matrix having openings and first pixel electrodes; a second substrate including thin film transistors for switching pixel regions which correspond to the openings according to applied electric signals, second pixel electrodes connected to drain electrodes of the thin transistors, and reflection layers for reflecting incident UV; a liquid crystal layer interposed between the first substrate and the second substrate, the liquid crystal layer including liquid crystal whose arrangement can be changed according to electric signals of the thin film transistors so as to selectively transmit light; and an array forming chamber forming a biomolecule array or polymer array, wherein the array forming chamber is spaced apart from the programmable mask to have a right angle to the UV light path reflected from the programmable mask and includes a sample plate on which the biomolecule or polymer array is formed, and a washing solution and a biomolecule or polymer flow in and out of the array forming layer.

The UV light source may be a LED two dimensional array or a laser diode two dimensional array.

The lens unit of the UV light generator may include a homogenizer lens unit to make UV light generated from the UV light source uniform, a field lens to concentrate UV light generated from the homogenizer lens unit, and a convex lens to make UV light generated from the field lens parallel.

According to another aspect of the present invention, there is provided a method of fabricating a biomolecule array or polymer array using a programmable mask for fabricating a biomolecule array or polymer array, wherein the programmable mask includes: a first substrate including a black matrix having openings and first pixel electrodes; a second substrate including thin film transistors for switching pixel regions which correspond to the openings according to applied electric signals and second pixel electrodes connected to drain electrodes of the thin film transistors; a liquid crystal layer interposed between the first substrate and the second substrate, the liquid crystal layer including liquid crystal whose arrangement can be changed according to electric signals of the thin film transistors so as to selectively transmit light; a first polarizing plate laminated on one side of the first substrate; a second polarizing plate laminated on one side of the second substrate; and a lens array layer laminated on one side of the second polarizing plate including lenses which correspond to the pixel regions, the method including: irradiating UV light to selective regions of a sample plate on which molecules having a protecting group are fixed through the programmable mask; and flowing a solution containing biomolecule or polymer monomer, required to fix to the molecule.

According to another aspect of the present invention, there is provided a method of fabricating a biomolecule array or polymer array using a programmable mask for fabricating a biomolecule array or polymer array, wherein the programmable mask includes: a first substrate including a black matrix having openings and first pixel electrodes; a second substrate including thin film transistors for switching pixel regions which correspond to the openings according to applied electric signals and second pixel electrodes connected to drain electrodes of the thin film transistors; a liquid crystal layer interposed between the first substrate and the second substrate, the liquid crystal layer including liquid crystal whose arrangement can be changed according to electric signals of the thin film transistors so as to selectively transmit light; a first polarizing plate laminated on one side of the first substrate; and a second polarizing plate laminated on one side of the second substrate including a polarizing layer and a biomolecule or polymer fixed layer, the method including: irradiating UV light to selective regions of a sample plate on which molecules having a protecting group are fixed through the programmable mask; and flowing a solution containing biomolecule or polymer monomer, required to fix to the molecule.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described more fully with reference to the accompanying drawings, in which exemplary embodiments of the invention are shown.

Figure 3A:
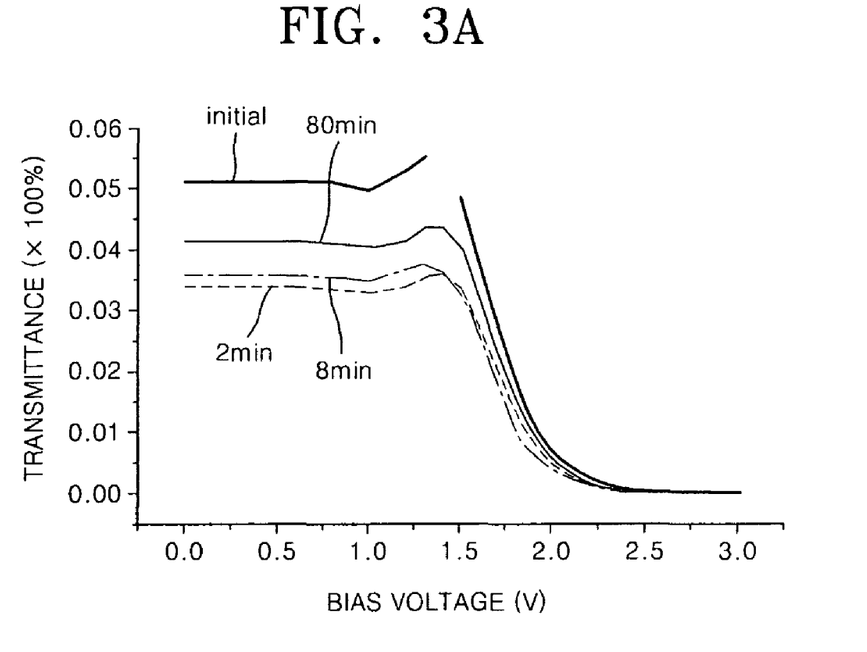
FIG. 3A is a graph showing transmittance-voltage with respect to UV exposure time of a LCD.
Figure 3B:
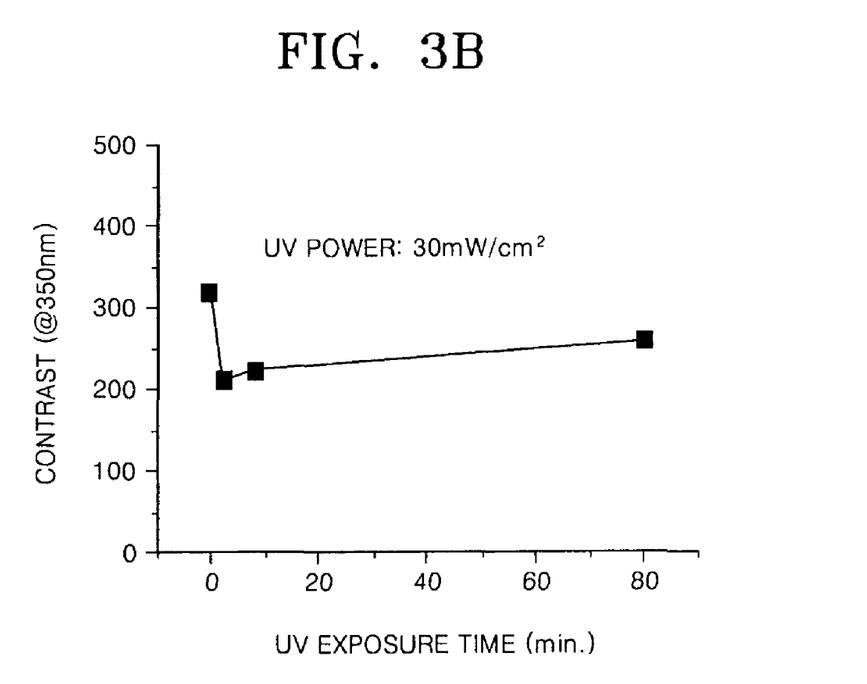
FIG. 3B is a graph showing contrast with respect to UV exposure time of a LCD.

FIG. 3A is a graph showing transmittance with respect to voltage for different UV exposure times of a LCD and FIG. 3B is a graph showing contrast with respect to UV exposure time of a LCD.

In order to analyze the stability of liquid crystal and an alignment film of a LCD with respect to UV, a UV polarizing plate of the LCD is separated and removed, and UV light having wavelength of 350 nm and an intensity of 160 mW/cm² used in a DNA synthesis is irradiated onto the LCD. Then, the polarizing plate for UV is attached back to the LCD and the transmittance with respect to voltage and contrast change with respect to UV exposure time are analyzed using a UV-visible spectrophotometer.

Referring to FIGS. 3A and 3B, a sudden decline in contrast occurs in an initial stage of UV irradiation, however, the contrast is stable thereafter. Thus, in complete blocking mode, as UV exposure time increases, UV leakage does not increase and yield of an oligomer chip is not affected. In addition, since the LCD is damaged by UV light, gray scale is destroyed and thus, cannot be used in displaying. However, the property of blocking UV light at a LCD complete blocking mode of a voltage of 2.5 V or above is not changed. On the other hand, a change in transmittance is observed at a complete transmission mode of a voltage of 1.5 V or less, however, can be used in the present invention. In the LCD of the present invention, only a complete transmission mode and a complete blocking mode are important and the voltage range in which transmittance with respect to voltage is suddenly changed, that is, the voltage range of 1.5-2.5 V, is not used in the present invention. In particular, even if there is excessive UV irradiation, the amount of UV leakage is nearly changed in the complete blocking mode. As shown in the graph of FIG. 3B, even if the LCD is exposed to UV light having an intensity of 160 mW/cm² for 80 minutes, contrast is not decreased as time elapses.

In synthesis of DNA oligomer, UV light is transmitted to a LCD in a complete transmission mode or completely blocked in a complete blocking mode for UV photo protection of the protecting group such as NPEOC [2-(2-nitrophenyl)-ethoxycarbonyl] group and MeNPOC [alpha-methyl-2-nitro piperonyl-oxycarbonyl] group, after optical pumping used in synthesis of photolithographic DNA which is attached to a side chain 5' of a DNA monomer.

When LCDs are used for display purposes, color is embodied by slightly changing the amount of light to specific pixels. However, when a LCD is used as a mask, UV light is completely transmitted to the LCD or completely intercepted for photo deprotection of UV.

In a DNA chip, an oligonucleotide is generally formed by coupling 25 DNA monomers together. Spots disposed on a DNA chip glass substrate, which correspond to openings in the liquid crystal, couple with DNA molecules according to predetermined DNA sequences. The spots disposed on the DNA chip, which correspond to the respective pixels, have different DNA sequences. Nucleotide formed of DNA includes adenine (A), thymin (T), cytosine (C), and guanine (G). First, as an example of synthesis, adenine (A) is formed on a region of the DNA chip which corresponds to a specific pixel. Then, when thymin (T) is synthesized in a region corresponding to another pixel, the region where adenine (A) is synthesized may be prevented from being synthesized with thymin (T). DNA bases which are attached to the DNA chip have a protecting group attached thereto, so if other bases approach the DNA bases, coupling does not occur before UV is irradiated.

Adenine (A) of the specific pixel described above also has a protecting group attached thereto, so if other bases approach the DNA bases, coupling does not occur before UV is irradiated. However, in order to synthesize thymin (T) with another pixel, during UV light irradiation, no UV light should reach the protecting group in adenine (A) attached to the specific pixel. That is, a specific pixel of the LCD according to the present invention should minimize UV leakage in a complete blocking mode. Spots on the DNA chip, which correspond to the respective pixels, have specific regions, wherein oligonucleotides exist in the region.

If some UV light is leaked from a specific pixel of the liquid crystal, thymin (T) is coupled to a specific adenine (A) on a region of the DNA chip which corresponds to the specific pixel, while some of the oligonucleotides become oligonucleotides having different sequences, and thus, the yield of the synthesis is decreased. Since incident UV light is in the form of a UV beam that is bigger than the area of the LCD, a liquid crystal cell is needed to completely block UV light. When UV is irradiated on an alignment layer and on liquid crystal, and thus, a gray scale is destroyed, damage due to UV occurs when the LCD is used as a display such as a TV or monitor. However, as illustrated in FIG. 3, the LCD can be used as a UV light valve which requires complete transmission mode and complete blocking mode only.

Figure 4:
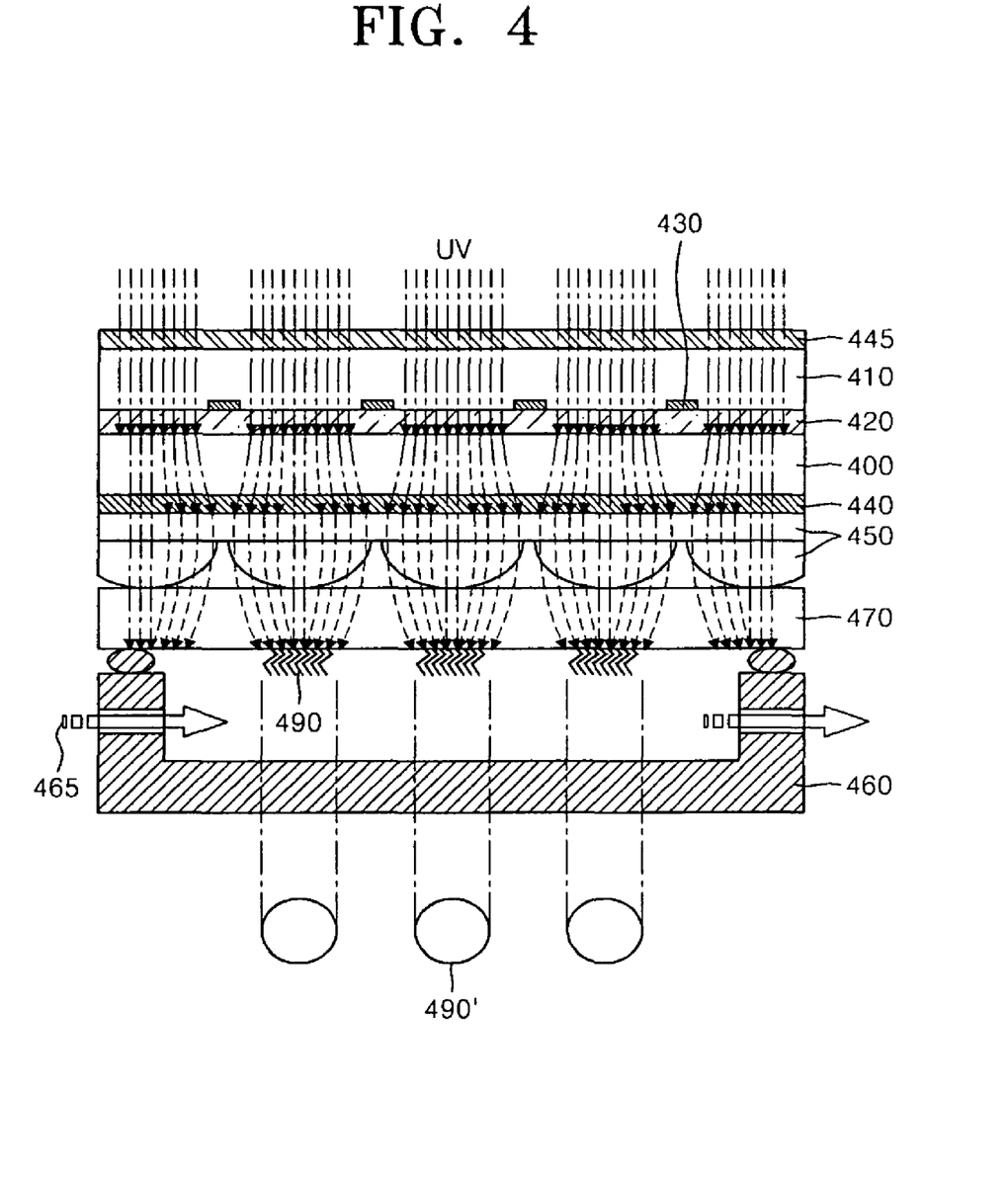
FIG. 4 is a side cross-sectional view of an apparatus for fabricating a biomolecule array or polymer array including a programmable mask in which a LCD according to an embodiment of the present invention is used.

FIG. 4 is a side cross-sectional view of an apparatus for fabricating a biomolecule array or polymer array including a programmable mask, in which a LCD according to an embodiment of the present invention is used.

Referring to FIG. 4, the apparatus includes a UV light generator (not illustrated), a programmable mask 410 to 450, a sample plate 470, and an array forming chamber 460.

Here, the programmable mask is an apparatus to control transmission, reflection, and interception of incident light in a pixel unit.

The programmable mask includes a first substrate 410 including a black matrix 430 having openings and first pixel electrodes (not illustrated); a second substrate 400 including thin film transistors (not illustrated) for switching pixel regions which correspond to the openings in response to applied electric signals and second pixel electrodes (not illustrated) connected to drain electrodes of the thin film transistors; a liquid crystal layer 420 interposed between the first substrate 410 and the second substrate 400 and including liquid crystal to selectively transmit light after arrangement of the liquid crystal layer 420 is changed according to electric signals of the thin film transistors; a first polarizing plate 445 laminated on one side of the first substrate 410; a second polarizing plate 440 laminated on one side of the second substrate 400; and a hemispherical lens array layer 450 laminated on one side of the second polarizing plate 440 and including hemispherical lenses which correspond to the pixel regions.

The programmable mask may further include a driving circuit for driving the thin film transistors on the second substrate 440 in the outer pixel region, but a driving circuit is not illustrated.

In the present invention, the polarizing substrates 440 and 445 may have high transmittance with respect to UV having a wavelength of 320-400 nm. The liquid crystal, which is a liquid crystal in which dyes are included in a nematic liquid crystal, is a guest-host type liquid crystal enabling light to be to intercepted or transmitted, since a vibration direction of linear polarized light and the light absorption axis of the dyes are the same or cross at right angles.

The biomolecule of the present invention may be a nucleic acid or a protein. The nucleic acid can be selected from the group consisting of DNA, RNA, PNA, LNA, and a hybrid thereof. The protein can be selected from the group consisting of enzyme, substrate, antigens, antibodies, ligands, aptamers, and receptors.

Biomolecules or polymers, for example, a DNA monomer having a side chain molecule that can be desorbed by UV light, such as 5'-NPPOC(or MeNPOC)-dT, 5'-NPPOC(or MeNPOC)-dA, 5'-NPPOC(or MeNPOC)-dG, and 5'-NPPOC (or MeNPOC)-dC, and a washing solution 465 can flow in and out of the array forming chamber 460.

The hemispherical lens array layer 450 can be used to focus the UV energy so as to make it high enough for desorption of molecules such as NPPOC and MeNPOC, wherein the NPPOC and MeNPOC can be attached to a side chain of a DNA nucleotide (dA,dT,dG,dC) and can be desorbed by UV light.

The programmable mask includes the hemispherical lens array layer 450 on the side where two glass substrates of a backlit LCD or the quartz substrates 400 and 410 through which UV is transmitted to be out and thus, the UV out through the each pixel is collected. Therefore, UV irradiation time is reduced and mixing with other adjacent patterns can be prevented.

The hemispherical lens can be formed using a hemispherical mold when a glass substrate is manufactured on the glass substrate of the backlit LCD. Instead of directly forming the hemispherical lens on the glass substrate of the backlit LCD, the hemispherical lens array may be formed on another glass substrate which is then attached to the glass substrate of the backlit LCD so that the hemispheres correspond one-to-one with the LCD pixels. The hemispherical lens optically collects incident light and improves the intensity of UV. In addition, the focal point of the hemispherical lens may be formed on the lower part of the DNA oligomer chip substrate disposed on the DNA oligomer synthesis chamber.

Figure 5:
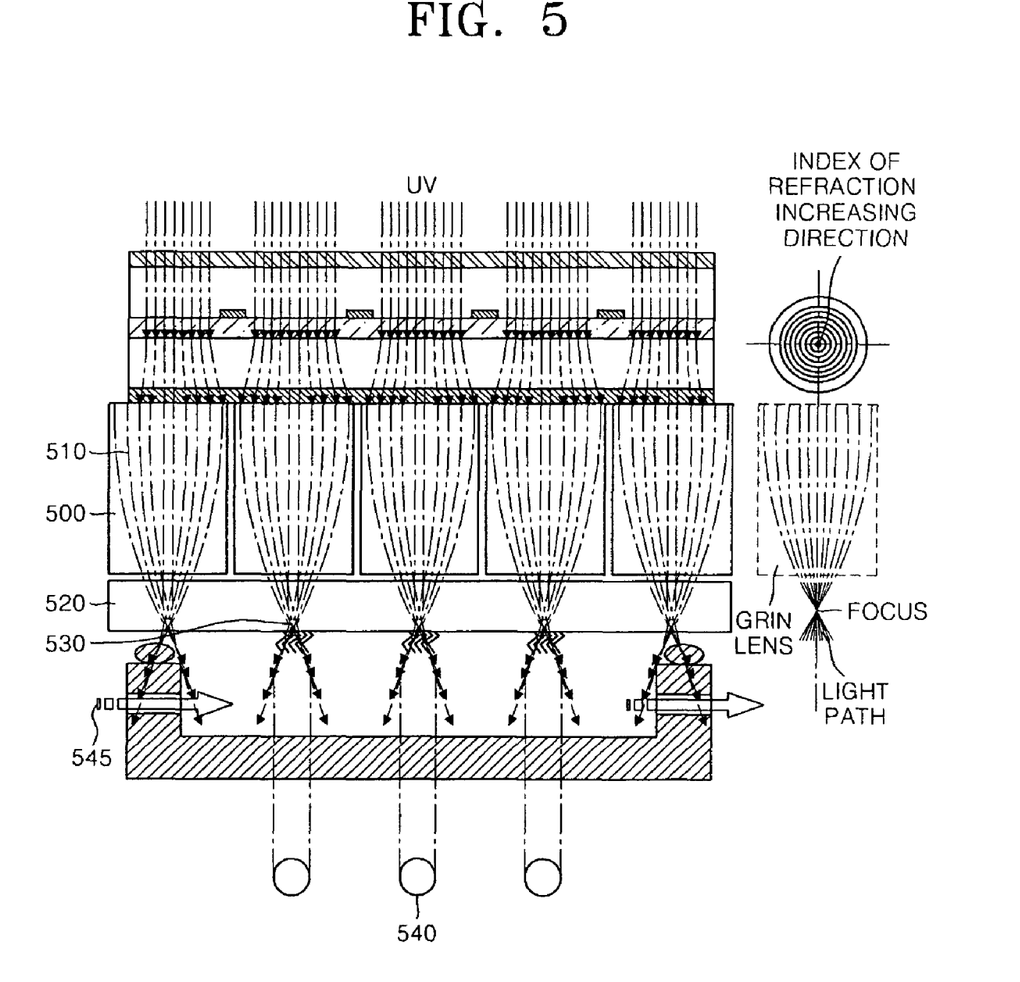
FIG. 5 is a side cross-sectional view of an apparatus for fabricating a biomolecule array or polymer array including a programmable mask in which a LCD according to another embodiment of the present invention is used.

FIG. 5 is a side cross-sectional view of an apparatus for fabricating biomolecule or a polymer, including a programmable mask in which a LCD according to another embodiment of the present invention is used.

Unlike in FIG. 4 in which the hemispherical lens array is used, a gradient index lens 500 is used in FIG. 5. Accordingly, UV irradiation time is significantly reduced, and thus, the time required for synthesis of an oligomer can be reduced. The gradient index lens 500 has a flat optical surface instead of a bent surface, and thus, assembling work to form array is easy. Also, the gradient index lens 500 is manufactured so that the index of refraction gradually increases toward the center of the lens and thus, light continuously bends until it finally focuses on one spot within the lens, thereby increasing the intensity of light due to light collecting.

The focal distance 530 of the gradient index lens may be chosen so that the focal point is formed around a lower part of a DNA oligomer chip substrate 520 disposed on a DNA synthesis chamber. Accordingly, the intensity of UV light is expected to increase by more than 5 times around the focal point 530 of the gradient index lens due to the collecting of UV light and thus, synthesis time can be reduced to ⅕ or less of the normal time. Also, a spot surface 540 of oligomer pattern can be significantly reduced and density of oligomer pattern can be improved.

A method of forming gradient index lens (Grin lens) array includes making a hole in an opaque substrate such as a silicon substrate so as to correspond one-to-one with the LCD pixels, inserting grin lenses into each hole disposed on the substrate, and attaching the substrate to a lower part of a glass substrate of the LCD. The grin lens of the present invention has an object of improving intensity of UV by optically collecting incident light. Therefore, the focal point of the grin lens may be selected to be formed on the lower surface of the DNA oligomer chip substrate disposed on the DNA oligomer synthesis chamber.

Figure 6:
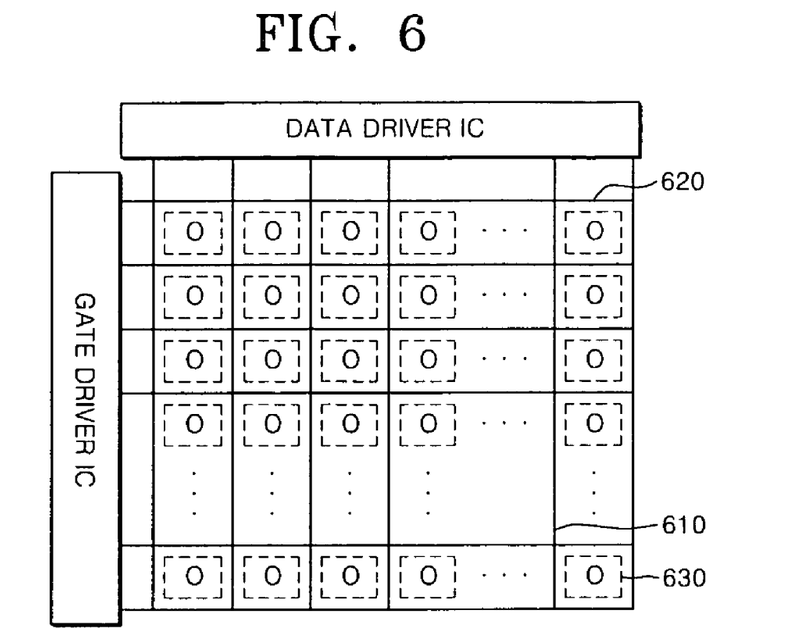
FIG. 6 is a plane view of a programmable mask and a driving circuit unit using the LCD according to an embodiment of the present invention.

FIG. 6 is a plane view of a programmable mask and a driving circuit unit using the LCD according to an embodiment of the present invention.

Referring to FIG. 6, the programmable mask and the driving circuit unit using the LCD according to an embodiment of the present invention includes a data signal line 610, a gate signal line 620, and a pixel 630 defined by the data signal line 610 and the gate signal line 620. As described above, the hemispherical lens array and the gradient index lens array are attached to the lower part of the glass substrate of the backlit LCD so as to correspond one-to-one with the LCD pixels and thus, a UV light collecting effect and pattern isolation effect between adjacent pixels can be achieved. Therefore, all pixels of the LCD can be used to form an oligomer pattern array, and thus, the density of the oligomer pattern of the present invention is twice that of the conventional art. The mark O in all pixels in FIG. 6 indicates that all pixels can be used.

Figure 7:
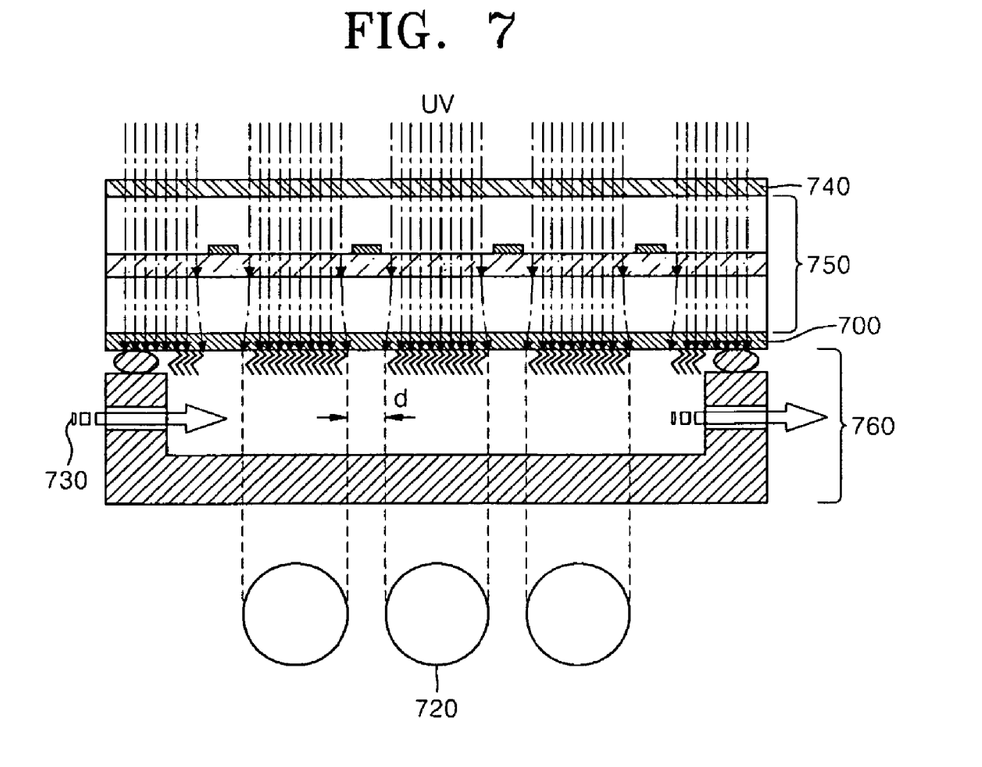
FIG. 7 is a side cross-sectional view of an apparatus for fabricating a biomolecule array or polymer array including a programmable mask in which a LCD according to another embodiment of the present invention is used.

FIG. 7 is a side cross-sectional view of an apparatus for fabricating biomolecule or a polymer including a programmable mask in which a LCD according to another embodiment of the present invention is used.

Referring to FIG. 7, the apparatus includes a LCD 750 including two substrates and a liquid crystal layer, and a first polarizing plate 740 and a second polarizing plate 700 disposed on the top and bottom surfaces of the LCD 750, respectively.

The second polarizing plate 700 disposed on the lower substrate of the LCD is formed to reduce optical diffraction by removing the distance between chip glass substrates in the oligomer synthesis chamber. The substrates are glass or quartz substrates formed of LCDs. The second polarizing plate 700 attached to the outer surface of the lower substrate is used not only for optical purposes to get polarized light but also as a DNA oligomer chip substrate.

In general, the glass substrate on the DNA oligomer synthesis chamber, that is, the DNA oligomer chip substrate, is formed of a glass substrate having a thickness of 600-1000 μm. UV light that passes through a lower polarizing plate of a backlit LCD passes through the glass substrate and a predetermined amount of UV light is diffracted. Disadvantages regarding this are fully described in the description of FIG. 1.

If the polarizing plate disposed on the lower part of the LCD is used as a substrate of an oligomer chip, the lower surface of the polarizing plate becomes a lid of the synthesis chamber and contacts solutions 730 that are essential for synthesis, such as a DNA monomer, a washing solution, and acetonitrile having a side chain, wherein the side chain is a molecule that is optically pumped through light desorption using UV light and may be, for example, 5'-NPPOC(or MeNPOC)-dT, 5'-NPPOC(or MeNPOC)-dA, 5'-NPPOC(or MeNPOC)-dG, and 5'-NPPOC(or MeNPOC)-dC, which are included in the synthesis chamber. The lower surface of the lower polarizing plate 700 is used as a substrate where DNA is synthesized by UV. As a result of the synthesis, a DNA spot is isolated from an adjacent spot (d), since the diffraction which occurs on the conventional DNA chip glass substrate is removed. In FIG. 7, a reference numeral 720 is a plane view of a synthesis spot.

Figure 8:
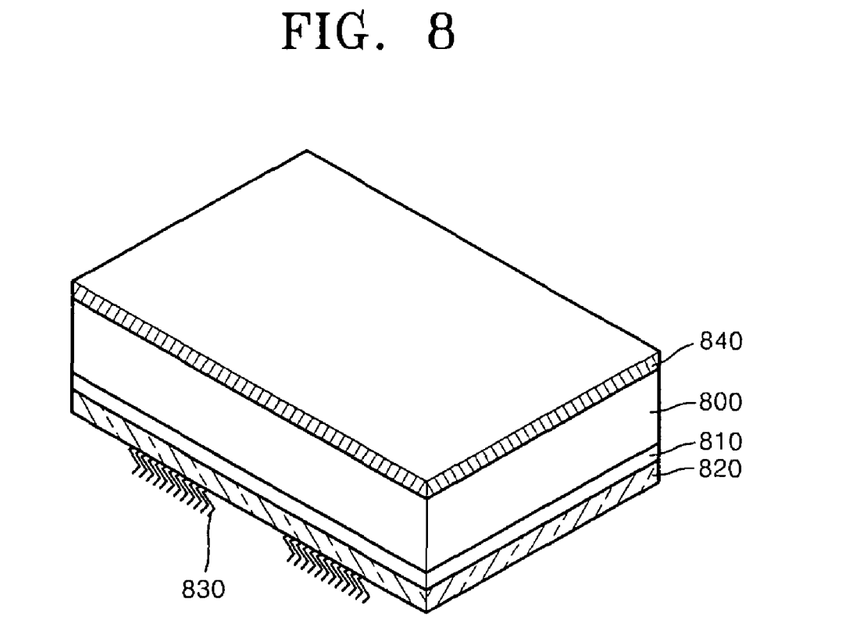
FIG. 8 is a perspective view of a second polarizing plate used in FIG. 7.

FIG. 8 is a perspective view of an embodiment of the second polarizing plate 700 shown in FIG. 7. Referring to FIG. 8, the second polarizing plate 700 includes a polarizing layer 800 formed of polarizing materials, protecting layers 810 and 840 laminated on both sides of the polarizing layer 800, and a biomolecule or polymer fixed layer 820 having a hydrophilic surface on which a biomolecule or polymer 830 can be fixed.

The biomolecule or polymer fixed layer 820 may be a thin film to which a hydroxyl group (—OH) or an amine group ($NH_3$) can be attached, for example, a silicon oxide layer. When the first DNA monomer flows into the synthesis chamber in a synthesis process, 3' part of a monomer is combined with the hydroxyl group (—OH) or the amine group ($NH_3$) attached to the fixed layer 820. Then, as the synthesis process progresses, a DNA oligomer 830 is formed.

The polarizing substrate on which the DNA oligomer is synthesized can be separated from the lower glass substrate of the backlit LCD to perform DNA hybridization after the DNA oligomer is synthesized.

Figure 9:
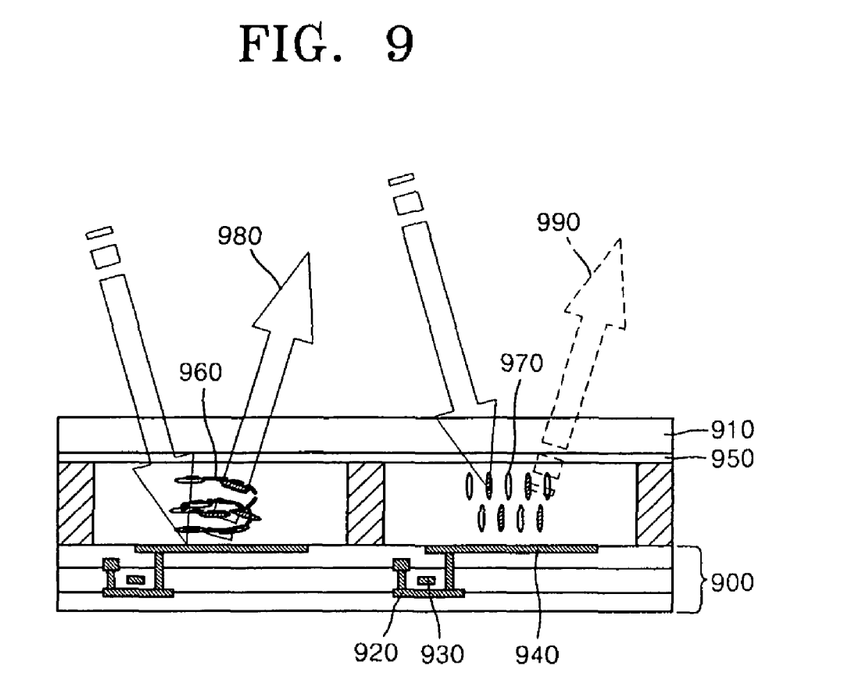
FIG. 9 is a side cross-sectional view of a general reflective LCD.
Figure 10:
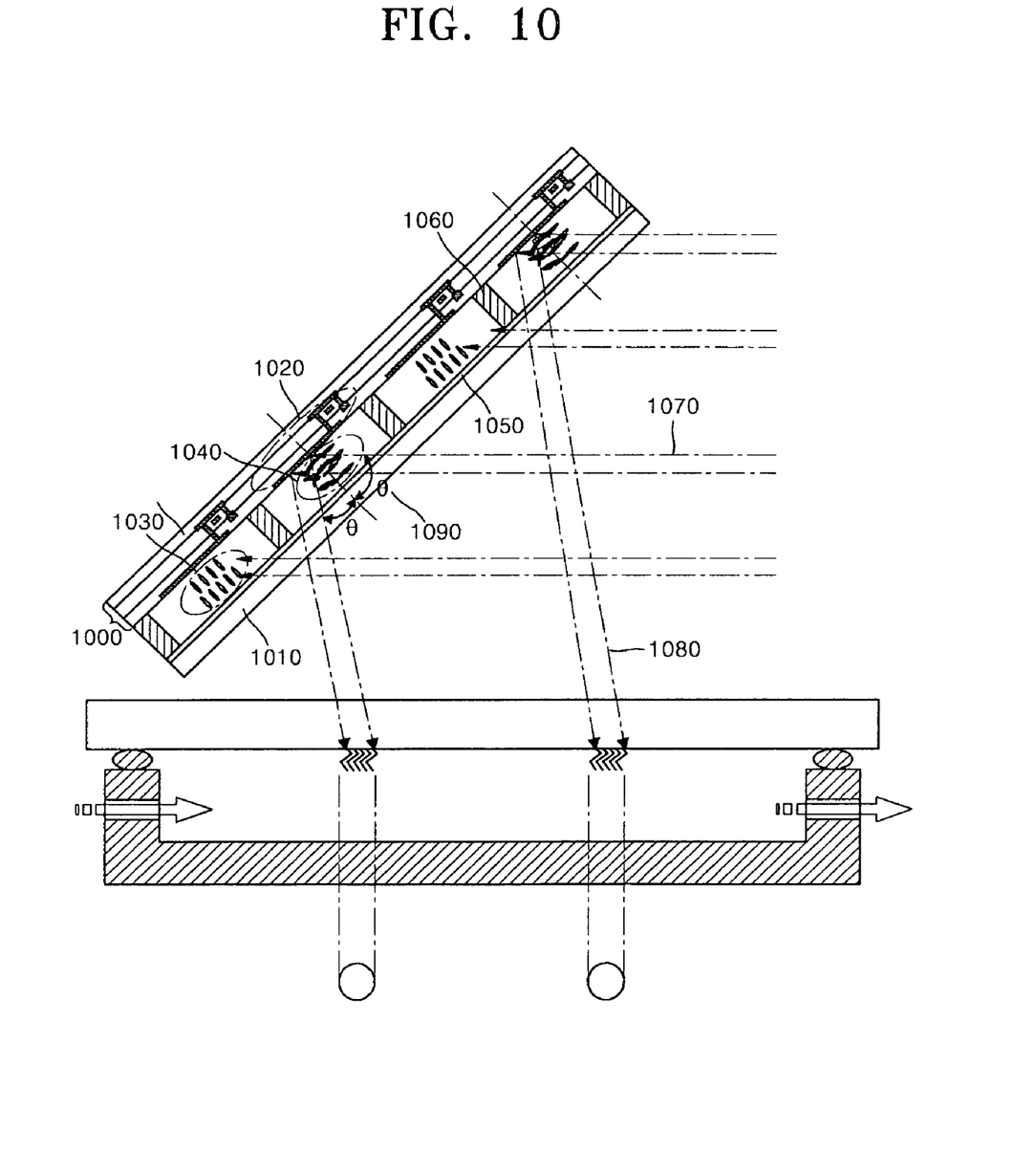
FIG. 10 is a side cross-sectional view of an apparatus for fabricating a biomolecule array or polymer array including a programmable mask in which a reflective LCD according to another embodiment of the present invention is used.

FIG. 9 is a side cross-sectional view of a general reflective LCD and FIG. 10 is a side cross-sectional view of an apparatus for fabricating a biomolecule array or polymer array including a programmable mask in which a reflective LCD according to another embodiment of the present invention is used.

Referring to FIG. 9, the general reflective LCD includes a first substrate 910 including a black matrix (not illustrated) having openings and first pixel electrodes 950, a second substrate 900 including thin film transistors 920 for switching pixel regions which correspond to the openings according to applied electric signals, second pixel electrodes 940 connected to drain electrodes 930 of the thin transistors, and reflection layers 940 for reflecting incident UV, and liquid crystal layers 960 and 970 interposed between the first substrate 910 and the second substrate 900 including liquid crystal to selectively transmit light after arrangement of the liquid crystal layer is changed according to electric signals of the thin film transistors 920.

The liquid crystal layer 960 is connected to a voltage, and thus, incident light is transmitted and reflected through the liquid crystal layer 960 and reflected light 980 is emitted. However, voltage is removed in another liquid crystal layer 970 and incident light is intercepted, and thus, reflected light cannot be emitted (990).

Referring to FIG. 10, the apparatus for fabricating a biomolecule array including a programmable mask in which a reflective LCD according to another embodiment of the present invention is used uses the reflective LCD of FIG. 9 as the programmable mask for fabricating a biomolecule array.

UV incident light 1070 is incident to a normal of an upper glass substrate 1010 of the reflective LCD panel with a predetermined incident angle 1090. A reflective angle is the same as the incident angle and light is reflected on the opposite side of the normal at the reflective angle. Reflected light 1080 synthesizes an oligomer nucleotide on the lower part of the DNA chip glass substrate of a DNA synthesis chamber.

The propagation direction of the reflected light 1080 reflected from the liquid crystal using the reflective LCD is set to cross at right angles to the upper DNA chip glass substrate of the DNA synthesis chamber.

Figure 11:
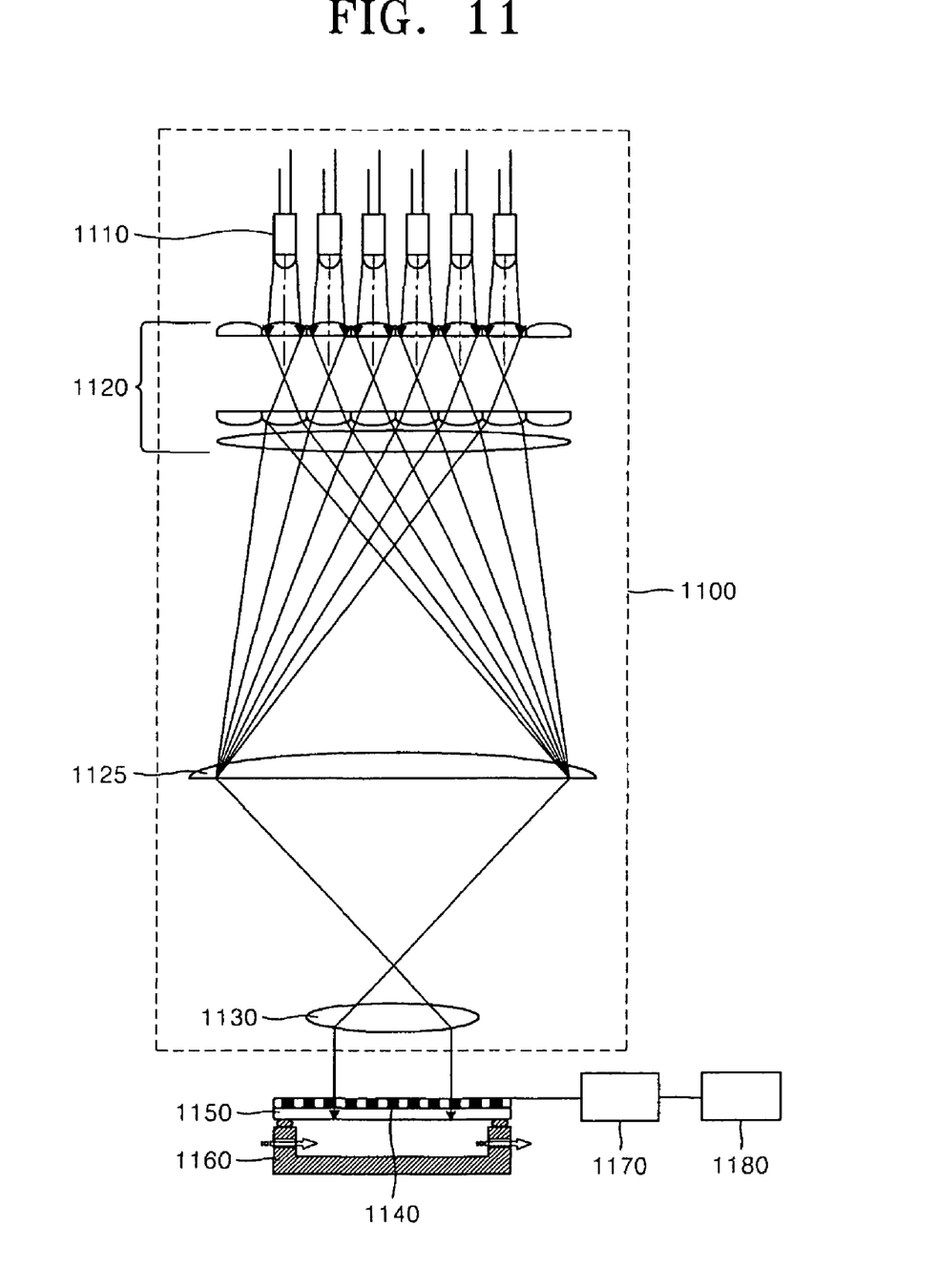
FIG. 11 is a schematic view illustrating a UV light generator according to an embodiment of the present invention.

FIG. 11 is a schematic view illustrating a UV light generator according to an embodiment of the present invention.

In general, conventional UV irradiators formed of a mercury lamp and optical lens for irradiating UV incident light to a LCD panel are large and have a volume of 1 to 3 meters. Therefore, a UV light generator having a relatively small size to get uniform UV beams is proposed in the present invention.

Referring to FIG. 11, the UV light generator 1100 of the present invention includes a UV light source 1110 and a lens unit 1120 or 1130 through which UV light irradiated from the UV light source 1110 passes.

The UV light source 1110 may be a LED two dimensional array or a laser diode two dimensional array.

The lens unit of the UV light generator 1110 may include a homogenizer lens unit 1120 to make UV generated from the UV light source 1110 uniform, a field lens 1125 to concentrate UV generated from the homogenizer lens unit 1120, and a convex lens 1130 to make UV generated from the field lens 1125 parallel.

As illustrated in the drawings described above, the present invention also provides a method of fabricating a biomolecule array or polymer array using the programmable mask or the apparatus for fabricating an array. The method includes irradiating UV light to selected regions of a sample plate on which molecules having a protecting group are fixed through the programmable mask and flowing a solution containing a biomolecule or a polymer monomer, required to fix to the molecule.

As described above, a biomolecule array or polymer array on which biomolecules or polymers are fixed with higher density than that of a conventional biomolecule array or polymer array can be achieved according to the present invention. Also, the time required for manufacturing the biomolecule or polymer array can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A programmable mask for fabricating a biomolecule array or polymer array, the mask comprising:
   a first substrate including a black matrix having openings for incident UV and first pixel electrodes;
   a second substrate including thin film transistors for switching pixel regions which correspond to the openings according to applied electric signals and second pixel electrodes connected to drain electrodes of the thin film transistors;
   a liquid crystal layer interposed between the first substrate and the second substrate, the liquid crystal layer including liquid crystal whose arrangement can be changed according to electric signals of the thin film transistors so as to selectively transmit light;

a first polarizing plate laminated on one side of the first substrate to polarize UV light;

a second polarizing plate laminated on one side of the second substrate to polarize UV light; and a lens array layer laminated on one side of the second polarizing plate including gradient index lenses which correspond to the pixel regions, wherein each gradient index lens has a flat optical surface and an index of refraction that gradually increases towards the center of each gradient index lens such that each gradient index lens has a focal point at a corresponding lower part of a sample plate of an array forming chamber in which the biomolecule array or polymer array is formed.

2. The programmable mask of claim 1, further comprising a driving circuit for driving the thin film transistors on the second substrate, the driving circuit being disposed outside the pixel regions.

3. The programmable mask of claim 1, wherein the lens is a gradient index lenses are inserted into holes in a substrate attached to the second polarizing plate.

4. The programmable mask of claim 1, wherein the polarizing plate has high transmittance with respect to UV light having wavelength of 320-400 nm.

5. The programmable mask of claim 1, wherein the biomolecule is one of nucleic acid and protein.

6. The programmable mask of claim 5, wherein the nucleic acid is selected from the group consisting of DNA, RNA, PNA, LNA, and a hybrid thereof.

7. The programmable mask of claim 5, wherein the protein is selected from the group consisting of enzyme, substrate, antigen, antibody, ligand, aptamer, and receptor.

8. An apparatus for fabricating a biomolecule array or polymer array comprising:

a UV light generator including a UV light source and a lens unit through which UV light irradiated from the UV light source passes;

a programmable mask for fabricating a biomolecule or polymer, wherein the programmable mask comprises:

a first substrate disposed so as to be spaced apart from the UV light generator, the first substrate including a black matrix having openings for incident UV light and first pixel electrodes;

a second substrate including thin film transistors for switching pixel regions which correspond to the openings according to applied electric signals and second pixel electrodes connected to drain electrodes of the thin transistors;

a liquid crystal layer interposed between the first substrate and the second substrate, the liquid crystal layer including liquid crystal whose arrangement can be changed according electric signals of the thin film transistors so as to selectively transmit light;

a first polarizing plate laminated on one side of the first substrate to polarize UV light; a second polarizing plate laminated on one side of the second substrate to polarize UV light; and a lens array layer laminated on one side of the second polarizing plate including gradient index lenses which correspond to the pixel regions, wherein each gradient index lens has a flat optical surface and an index of refraction that gradually increases towards the center of each gradient index lens; and an array forming chamber forming a biomolecule array or polymer array, wherein the array forming chamber is laminated on the programmable mask and includes a sample plate on which the biomolecule or polymer array is formed, and a washing solution and a biomolecule or polymer flow in and out of the array forming layer, wherein a focus point of each gradient index lens is formed around a corresponding lower part of the sample plate.

9. The apparatus of claim 8, wherein the UV light source is one of a LED two dimensional array and a laser diode two dimensional array.

10. The apparatus of claim 8, wherein the lens unit of the UV light generator comprises a homogenizer lens unit to make UV light generated by the UV light source uniform, a field lens to concentrate UV light generated by the homogenizer lens unit, and a convex lens to make UV light generated by the field lens parallel.

11. The apparatus of claim 8, wherein the focal point of the lens of the programmable mask is formed on the sample plate where a biomolecule array or polymer array is formed.

12. The apparatus of claim 8, wherein gradient index lenses are inserted into holes in a substrate attached to the second polarizing plate.

13. A method of fabricating a biomolecule array or polymer array using a programmable mask for fabricating a biomolecule array or polymer array, wherein the programmable mask comprises: a first substrate including a black matrix having openings and first pixel electrodes; a second substrate including thin film transistors for switching pixel regions which correspond to the openings according to applied electric signals and second pixel electrodes connected to drain electrodes of the thin film transistors; a liquid crystal layer interposed between the first substrate and the second substrate, the liquid crystal layer including liquid crystal whose arrangement can be changed according to electric signals of the thin film transistors so as to selectively transmit light; a first polarizing plate laminated on one side of the first substrate; a second polarizing plate laminated on one side of the second substrate; and a lens array layer laminated on one side of the second polarizing plate including gradient index lenses which correspond to the pixel regions, wherein each gradient index lens has a flat optical surface and an index of refraction that gradually increases towards the center of each gradient index lens, the method comprising:

irradiating UV light to selective regions of a sample plate on which molecules having a protecting group are fixed through the programmable mask; and flowing a solution containing biomolecule or polymer monomer molecule required to fix to the molecule, wherein a focus point of each gradient index lens is formed around a corresponding lower part of the sample plate.

* * * * *